United States Patent
Kawamura

(10) Patent No.: US 11,187,759 B2
(45) Date of Patent: Nov. 30, 2021

(54) GROUND FAULT DETECTION DEVICE

(71) Applicant: Yazaki Corporation, Tokyo (JP)

(72) Inventor: Yoshihiro Kawamura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 250 days.

(21) Appl. No.: 16/712,557

(22) Filed: Dec. 12, 2019

(65) Prior Publication Data

US 2020/0191881 A1    Jun. 18, 2020

(30) Foreign Application Priority Data

Dec. 18, 2018 (JP) .............................. JP2018-236247

(51) Int. Cl.
| | |
|---|---|
| *G01R 31/52* | (2020.01) |
| *G01R 27/26* | (2006.01) |
| *H02J 7/34* | (2006.01) |
| *G01R 31/50* | (2020.01) |
| *G01R 27/02* | (2006.01) |

(52) U.S. Cl.
CPC ......... *G01R 31/52* (2020.01); *G01R 27/2623* (2013.01); *H02J 7/345* (2013.01); *G01R 27/025* (2013.01); *G01R 31/50* (2020.01)

(58) Field of Classification Search
CPC ........ G01R 31/00; G01R 31/50; G01R 31/52; G01R 27/00; G01R 27/02; G01R 27/025; G01R 27/26; G01R 27/2617; G01R 27/2623; H02J 7/00; H02J 7/0029; H02J 7/34; H02J 7/345

USPC ........ 324/500, 509; 340/500, 540, 635, 650; 361/1, 42

See application file for complete search history.

(56) References Cited

U.S. PATENT DOCUMENTS

| | | | | |
|---|---|---|---|---|
| 8,198,902 | B2 * | 6/2012 | Kawamura | ............ G01R 31/52 |
| | | | | 324/551 |
| 10,416,223 | B2 * | 9/2019 | Kawamura | ............ G01R 31/52 |
| 10,611,243 | B2 * | 4/2020 | Kawamura | ........... B60L 3/0069 |
| 10,613,156 | B2 * | 4/2020 | Kawamura | ........... B60L 3/0069 |
| 10,775,447 | B2 * | 9/2020 | Kawamura | ............ G01R 31/14 |
| 10,890,627 | B2 * | 1/2021 | Kawamura | ............ G01R 31/50 |
| 2011/0006781 | A1 | 1/2011 | Kawamura | |
| 2018/0252754 | A1 * | 9/2018 | Mochizuki | ........... G01R 27/025 |

FOREIGN PATENT DOCUMENTS

JP    2011-017586 A    1/2011

\* cited by examiner

*Primary Examiner* — Hoai-An D. Nguyen
(74) *Attorney, Agent, or Firm* — Sughrue Mion, PLLC

(57) ABSTRACT

A ground fault detection device comprising a capacitor which serves as a flying capacitor, a switch group which switches between a V0-charging path, a Vcn-charging path, a Vcp-charging path and a charging voltage measurement path for the capacitor, and a controller which controls the switch group and calculates an insulation resistance based on V0, Vcn and Vcp, wherein V0 is a measured value on the V0-charging path, Vcn is a measured value on the Vcn-charging path, and Vcp is a measured value on the Vcp charging path, wherein, if Vcn can be considered as zero, the controller switches to the Vcp-charging path and performs measurement while keeping a charged state of the capacitor, wherein Vcp obtained after discharging the capacitor is subtracted from a measured value obtained from the measurement in order to calculate Vcn.

2 Claims, 9 Drawing Sheets

FIG.4 Charging Measurement and Discharging path

GROUND FAULT DETECTION DEVICE

BACKGROUND OF THE INVENTION

Technical Field

The present invention relates to a ground fault detection device using a flying capacitor.

Background Art

In a hybrid vehicle including an engine and an electric motor as drive sources, and in a vehicle such as an electric vehicle, a battery mounted on a vehicle chassis is charged, wherein electric energy supplied from the battery is used to generate a driving force. Generally, power supply circuits associated to batteries are configured as high voltage circuits which handle a high voltage larger than or equal to 200V, wherein the high voltage circuit including a battery is non-grounded, being electrically insulated from a vehicle chassis which forms a reference potential point for a ground in order to ensure safety.

Furthermore, there are vehicles with boosters which increase and apply a positive potential of a battery to the load in order to increase a driving efficiency of a load. In a vehicle with such a booster, in addition to an output of the battery, i.e. a primary side of the booster, an output of the booster, i.e. a secondary side of the booster is non-grounded, being electrically insulated from the vehicle chassis, wherein the vehicle chassis is not configured to serve as a ground for the battery and the booster. Therefore, in vehicles with boosters, it is necessary to detect an insulation resistance between the battery and the ground as well as an insulation resistance between the ground and the secondary side of the booster in order to monitor a ground fault status.

Thus, a ground fault detection device is provided in order to monitor a system with the battery and the booster, more specifically a ground fault condition between the vehicle chassis and a main power supply system which leads from the battery via the booster to a load such as an electric motor. Many ground fault detection devices utilize a system with a capacitor called flying capacitor.

FIG. 8 is a block diagram showing an example for configuration of a conventional ground fault detection device 500 based on a flying capacitor. The ground fault detection device 500 is a device which connects to a non-grounded battery B and detects a ground fault of a system with the battery B and the booster 520. The ground fault detection device 500, the booster 520 and a load 540 etc. are controlled by an external control device which is a higher-level device (not shown).

Here, RLp1 shall represent an insulation resistance between a cathode and a ground at the output side of the battery B, i.e. at a primary side, and RLn1 an insulation resistance between an anode and the ground. Furthermore, RLp2 shall represent an insulation resistance between the cathode and the ground at the output side of the booster 520, i.e. at a secondary side, and RLn2 an insulation resistance between the anode and the ground. A cathode side insulation resistance RLp is defined by a resulting resistance from RLp1 and RLp2, wherein an anode side insulation resistance RLn is defined by a resulting resistance from RLn1 and RLn2. And an insulation resistance RL of the system is defined by a resulting resistance from the cathode side insulation resistance RLp and the anode side insulation resistance RLn.

A capacitor C1 which functions as a flying capacitor is charged through a path formed by on-off-switching of switches S1-S4, wherein it is provided that its charging voltage is measured at the control device 510.

As a method for obtaining the insulation resistance RL, a technology is known in which V0, Vcn and Vcp are measured, (Vcn+Vcp)/V0 is calculated, and pre-created table data are referenced in order to calculate the insulation resistance RL. If the obtained insulation resistance RL is below a predetermined reference value, the ground fault detection device 500 determines that a ground fault has occurred, wherein the ground fault detection device 500 issues an alert to an external control device.

Here, V0 represents a value corresponding to a voltage of the battery B which is measured on a path formed by switching switches S1 and S2 on. In this case, one of electrode plates of the capacitor C1 which is connected to the cathode side of the battery B shall be referred to as a first electrode plate, the other which is connected to the anode side of the battery B shall be referred to as a second electrode plate.

Vcn represents a voltage value which is measured on a charging path by the cathode side of the battery B which is formed by switching switches Si and S4 on, wherein this voltage value involves influence of the anode side insulation resistance RLn. Vcp represents a voltage value which is measured on a charging path by the anode side of the battery B which is formed by switching switches S2 and S3 on, wherein this voltage value involves influence of the cathode side insulation resistance RLp.

Generally, for ground fault detection, measurement is carried out with each cycle including V0-, Vcn-, V0- and Vcp-measurements, wherein at each switching between the measurements, the charging voltage of the capacitor C1 on the path formed by switching the switches S3 and S4 on is read and the capacitor C1 is discharged.

In this context, when measuring Vcn with the switches S1 and S4 being on while the booster 520 is performing a voltage increasing operation, voltage formed by dividing an increased voltage with the cathode side insulation resistance RLp and the anode side insulation resistance RLn is applied to the second electrode plate of the capacitor C1.

If this voltage is larger than a voltage which is applied from the cathode side of the battery B, electrical current takes a detour and therefore the capacitor C1 is charged with a polarity opposed to a polarity as normal. This means that the side of the second electrode plate has a higher potential. In this case, a voltage of zero is measured at the control device 510 since the control device 510 generally performs measurements within a positive potential range, which can make the calculation of the insulation resistance RL impossible.

In order to solve this problem, the Patent Document 1 discloses a ground fault detection device 600 with a negative potential measurement circuit 620 as shown in FIG. 9. Here, the negative potential measurement circuit 620 includes a diode Da, a resistance Ra, a switch Sa formed from an optical MOS-FET, and a resistance Rb. Furthermore, the ground fault detection device 600 has a switch S5 and a resistance R5.

When the capacitor C1 has been charged with the polarity opposed to the polarity as normal in measuring Vcn, the ground fault detection device 600 measures the charging voltage of the capacitor C1 through an A/D 2 of the control device 610 with the switches S5 and Sa being on rather than measuring the charging voltage through an A/D 1 of the control device 610 with the switches S3 and S4 being on. In this way, the charging voltage of the capacitor C1 which has been charged with the opposed polarity is measured so that the calculation of the insulation resistance RL is possible.

CITATION LIST

Patent Literature

Patent Document 1: JP 2011-17586 A

SUMMARY OF THE INVENTION

According to the Patent Document 1, measurement of the charging voltage is enabled for a ground fault detection device with a booster by providing the negative potential measurement circuit with a diode and resistances and a switch even if the flying capacitor is charged with an opposed polarity.

However, the negative potential measurement circuit is an additional circuit which is used only when detour and arrival of electrical current has occurred due to increased voltage. Therefore, omitting this circuit is desirable.

Therefore, an objective of the present invention is to enable the measurement of the charging voltage for a ground fault detection device based on a flying capacitor for a system with a booster without such an additional circuit in case of detour and arrival of electrical current due to the increased voltage.

In order to achieve the objective, a ground fault detection device according to the present invention is provided which is configured to be connected to a non-grounded battery which is configured to supply a load with electric power via a booster circuit, wherein the ground fault detection device calculates an insulation resistance of a system including the battery in order to detect a ground fault, the ground fault detection device being characterized by:

a capacitor which serves as a flying capacitor;
a switch group which switches between
 a V0-charging path with the battery and the capacitor,
 a Vcn-charging path with the battery, a negative side insulation resistance and the capacitor, the negative side insulation resistance being an insulation resistance between a negative side of the battery and a ground,
 a Vcp-charging path with the battery, a positive side insulation resistance and the capacitor, the positive side insulation resistance being an insulation resistance between a positive side of the battery and the ground, and
 a charging voltage measurement path for the capacitor; and
a controller which controls the switch group and calculates the insulation resistance based on V0, Vcn and Vcp, wherein V0 is a measured value on the V0-charging path, Vcn is a measured value on the Vcn-charging path, and Vcp is a measured value on the Vcp charging path;

wherein, if Vcn can be considered as zero, the controller switches to the Vcp-charging path and performs measurement while keeping a charged state of the capacitor, wherein Vcp obtained after discharging the capacitor is subtracted from a measured value obtained from the measurement in order to calculate Vcn. The switch group may be formed from two C-contact relays.

With the present invention, the measurement of the charging voltage for a ground fault detection device based on a flying capacitor for a system with a booster without an additional circuit in case of detour and arrival of electrical current due to increased voltage.

DETAILED DESCRIPTION OF THE PREFERRED EMBODIMENTS

Figure 1:
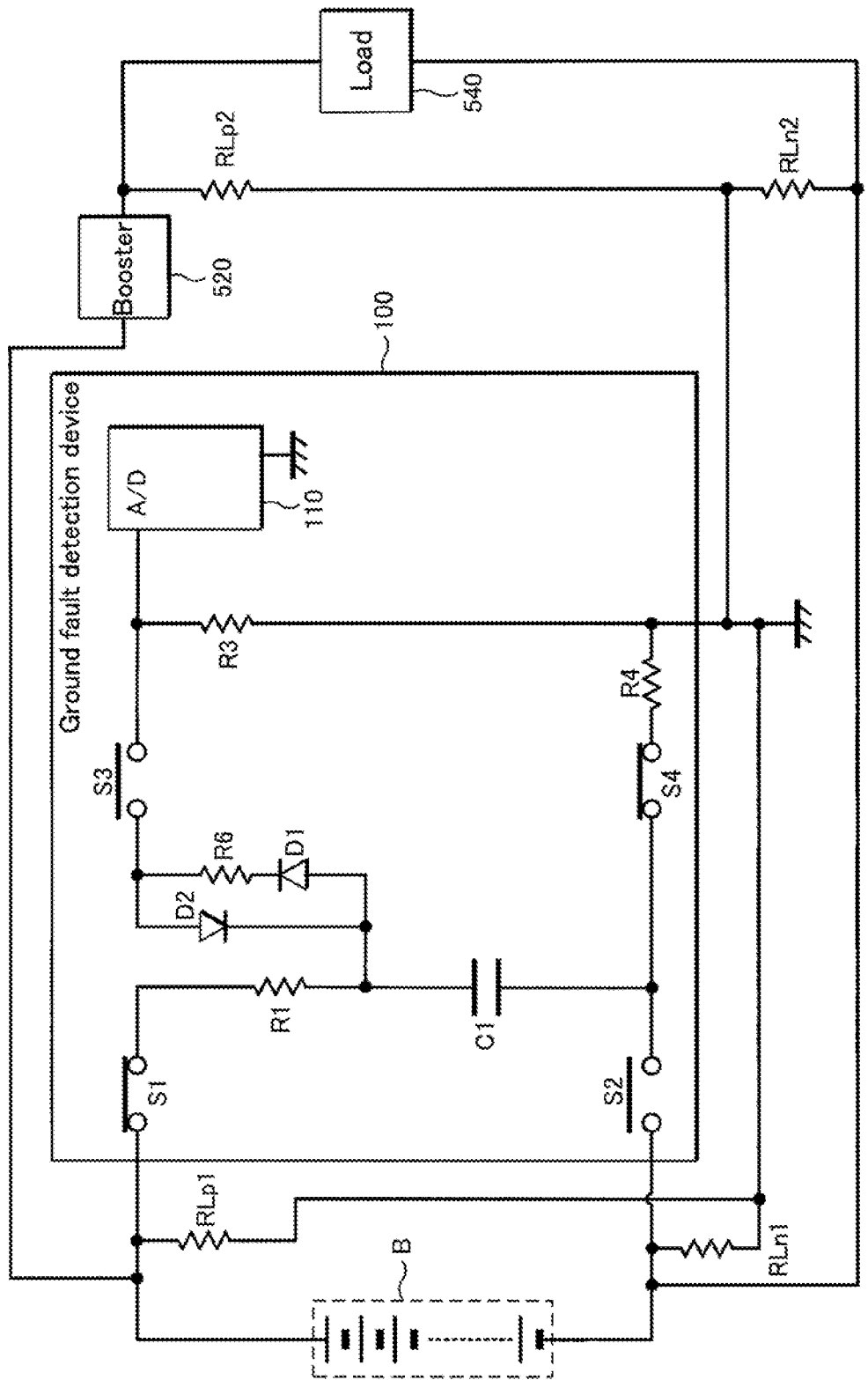
FIG. 1. is a block diagram showing an arrangement for a ground fault detection device according to an embodiment of the present invention.

A ground fault detection device as an embodiment of the present invention shall be described with reference to the drawings. FIG. 1 is a block diagram showing an arrangement for a ground fault detection device 100 according to the present embodiment. The ground fault detection device 100 is a device which connects to a non-grounded battery B providing a load 540 with electric power, wherein the device detects a ground fault of a system with the battery B and the booster 520. The ground fault detection device 100, the booster 520 and the load 540 etc. are controlled by an external control device which is a higher-level device (not shown).

Here, RLp 1 shall represent an insulation resistance between a cathode and a ground at the output side of the battery B, i.e. at a primary side, and RLn1 an insulation resistance between an anode and the ground. Furthermore, RLp2 shall represent an insulation resistance between the cathode and the ground at the output side of the booster 520, i.e. at a secondary side, and RLn2 an insulation resistance between the anode and the ground. A cathode side insulation resistance RLp is defined by a resulting resistance from RLp1 and RLp2, wherein an anode side insulation resistance RLn is defined by a resulting resistance from RLn1 and RLn2. And an insulation resistance RL of the system is defined by a resulting resistance from the cathode side insulation resistance RLp and the anode side insulation resistance RLn.

The battery B is formed from a chargeable battery such as a lithium-ion battery, wherein a cathode of the battery B is connected via the booster 520 to a positive electrode of the load 540 such as an electric motor and a anode of the battery B is connected to a negative electrode of the load 540.

As shown in this figure, the ground fault detection device 100 includes a capacitor C1 which serves as a flying capacitor.

The ground fault detection device 100 includes four switches S1-S4 around the capacitor C1 in order to switch a measurement path as well as to control charging and discharging the capacitor C1. These switches may be formed from insulating-type switching elements such as an optical MOS-FET.

A switch S1 is connected at one terminal to the cathode of the battery B and at another terminal to the resistance R1. The resistance R1 is connected at another terminal to a first electrode plate of the capacitor C1. While a diode is conventionally connected between the switch S1 and the resistance R1, the diode having a forward direction from the cathode of the battery B to the capacitor C1, such a diode is omitted according to the present embodiment.

The first electrode plate of the capacitor C1 is also connected to one terminal of a parallel circuit of a diode D1 and a diode D2, wherein a resistance R6 is connected in series to the diode D1. Here, the diode D1 and the diode D2 are connected so that their forward directions are opposed, wherein an anode of the diode D1 is connected to the first electrode plate side of the capacitor C1.

Another terminal of the parallel circuit of the diode D2 and the diode D1 with the resistance R6 connected in series thereto is connected to one terminal of the switch S3, wherein another terminal of the switch S3 is connected to a resistance R3 and to an A/D port of a control device 110. Another terminal of the resistance R3 is grounded, wherein a voltage generated at the resistance R3 shall be measured by the control device 110.

A switch S2 is connected at one terminal to the anode of the battery B and at another terminal to a second electrode plate of the capacitor C1. A switch S4 is connected at one terminal to the second electrode plate of the capacitor C1 and at another terminal to the resistance R4. Another terminal of the resistance R4 is grounded.

The control device 110 is formed from a microcomputer etc. and performs various operations within the ground fault detection device 100 by carrying out a program which is integrated in advance. More specifically, the control device 110 controls the switches S1-S4 individually to switch a measurement path and also controls charging and discharging the capacitor C1.

Furthermore, the control device 110 receives an analog voltage level generated at the resistance R3 as an input via the A/D port. The control device 110 performs measurement e.g. within a positive predetermined voltage range from 0V to 5V and calculate an insulation resistance RL by performing a predetermined calculation based on a measured value. Measurement data of the control device 110 and an alert in case of a detected ground fault etc. are output to an external control device.

Figure 2:
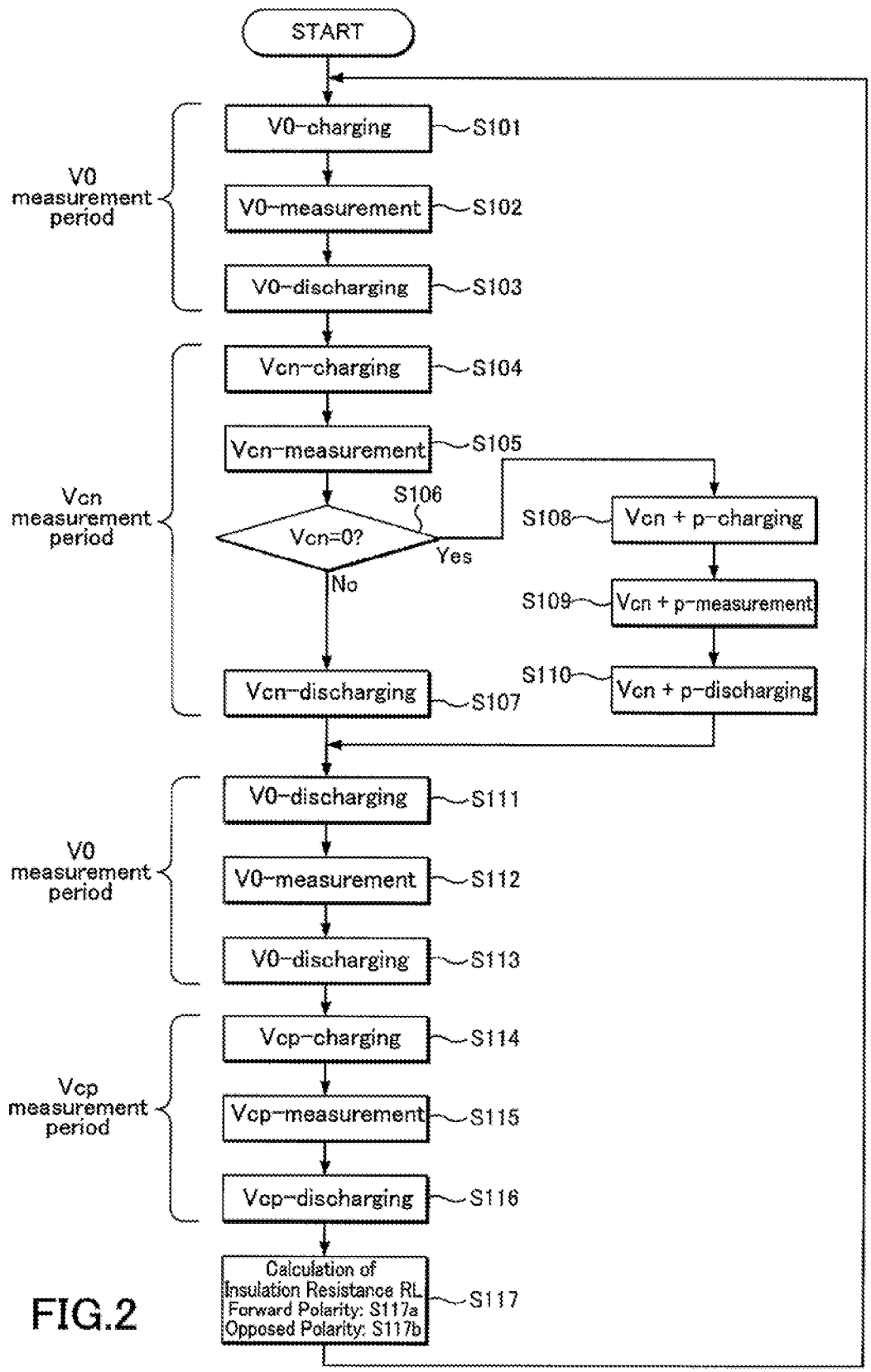
FIG. 2. is a flow chart illustrating how the ground fault detection device according to the present embodiment operates.

Operation of the above described arrangement for the ground fault detection device 100 will be explained with reference to a flow chart of FIG. 2. For example, the ground fault detection device 100 performs measurement operations iteratively with each cycle including a V0-measurement period (S101-S103), a Vcn-measurement period (S104-S107), a V0-measurement period (S111-S113), a Vcp-measurement period (S114-S116) and calculation of the insulation resistance RL (S117a).

However, if detour and arrival of electrical current has occurred due to an increased voltage during the Vcn-measurement period, Vcn+p is additionally measured (S108-S110) in order to calculate the insulation resistance RL (S117b).

First, the V0-measurement period (S101-S103), the Vcn-measurement period (S104-S107), the V0-measurement period (S111-S113), the Vcp-measurement period (S114-S116) and the calculation of the insulation resistance RL (S117) shall be described which are performed in case of no detour of electrical current due to an increased voltage. In the following description, when the first electrode plate side of the capacitor C1 is positive, it shall be referred to as a "forward polarity", while it shall be referred to as a "opposed polarity" when the second electrode plate is positive.

Figure 3:
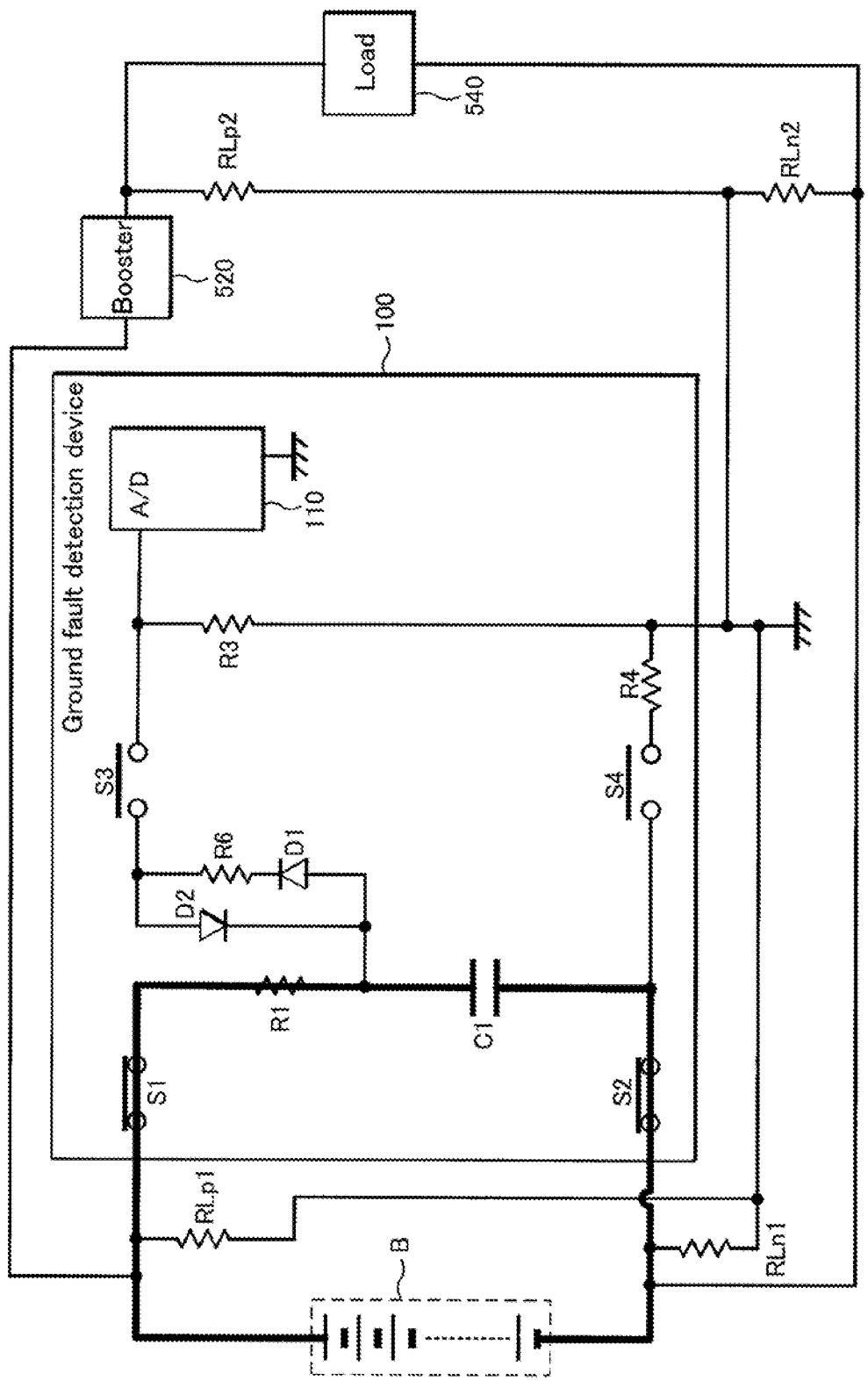
FIG. 3. is a diagram illustrating a V0-charging path.

During the V0-measurement period, a voltage V0 corresponding to the battery B voltage is measured. For this purpose, the switch Si and the switch S2 are switched on and the switch S3 and the switch S4 are switched off in order to perform charging of the voltage V0 (S101). In this case, as shown in FIG. 3, the battery B, the resistance R1 and the capacitor C1 form a charging path, wherein the capacitor C1 is charged with the forward polarity.

Figure 4:
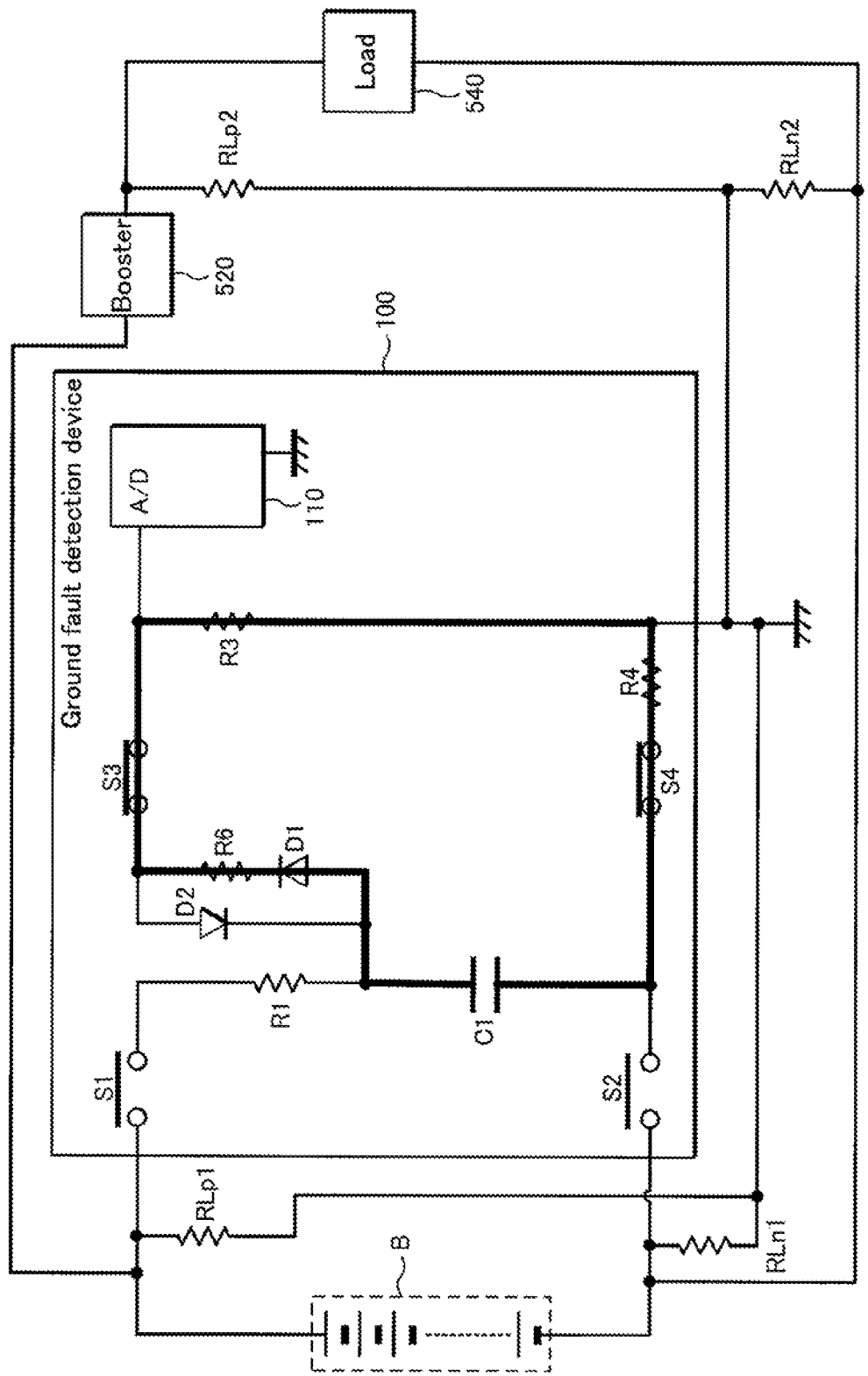
FIG. 4. is a diagram illustrating a charging measurement and discharging path.

Then, as shown in FIG. 4, the switch Si and the switch S2 are switched off and the switch S3 and the switch S4 are switched on in order to perform measurement of V0 at the control device 110 (S102). And the same circuit is used to discharge the capacitor C1 for a subsequent measurement (S103).

Figure 5:
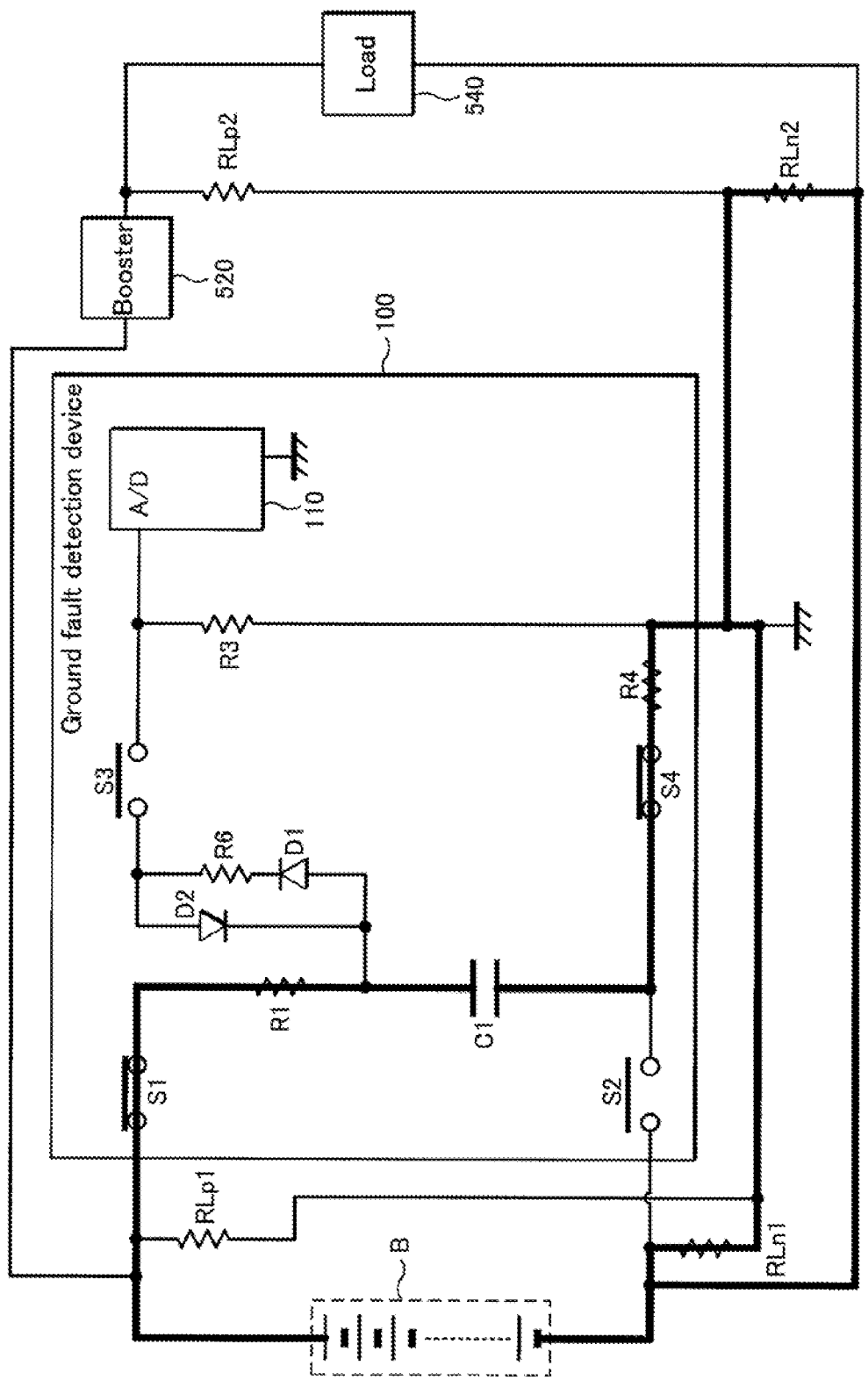
FIG. 5. is a diagram illustrating a Vcn-charging path.

During the Vcn-measurement period, a voltage which reflects an influence of the anode side insulation resistance RLn is measured. For this purpose, the switch S1 and the switch S4 are switched on and the switch S2 and the switch S3 are switched off in order to perform charging of the voltage Vcn (S104). In this case, as shown in FIG. 5, the battery B, the resistance R1, the capacitor C1, the resistance R4 and the anode side insulation resistance RLn form a measurement path.

Then, as shown in FIG. 4, the switch Si and the switch S2 are switched off and the switch S3 and the switch S4 are switched on in order to perform measurement of Vcn at the control device 110 (S105).

When the booster 520 is performing a voltage increasing operation, a voltage formed by dividing an increased voltage with the cathode side insulation resistance RLp and the anode side insulation resistance RLn is applied to the second electrode plate of the capacitor C1. If this voltage is larger than a voltage which is applied from the cathode side of the battery B, electrical current will take a detour and arrive.

If no detour of electrical current occurs, the capacitor C1 will be charged with the forward polarity and therefore Vcn>0 (S106: No). In this case, a measured value at this time can be Vcn. Then, discharging is performed with the same circuit (S107).

If detour and arrival of electrical current has occurred, the capacitor C1 will be charged with the opposed polarity and therefore Vcn=0 (S106: Yes). However, considering influence of noise etc., for example a voltage under several tens of microvolts shall be considered as zero. Processes which are applied in this case will be explained in the following description.

The V0-measurement period (S111-S113) is similar to the V0-measurement period (S101-S103).

Figure 6:
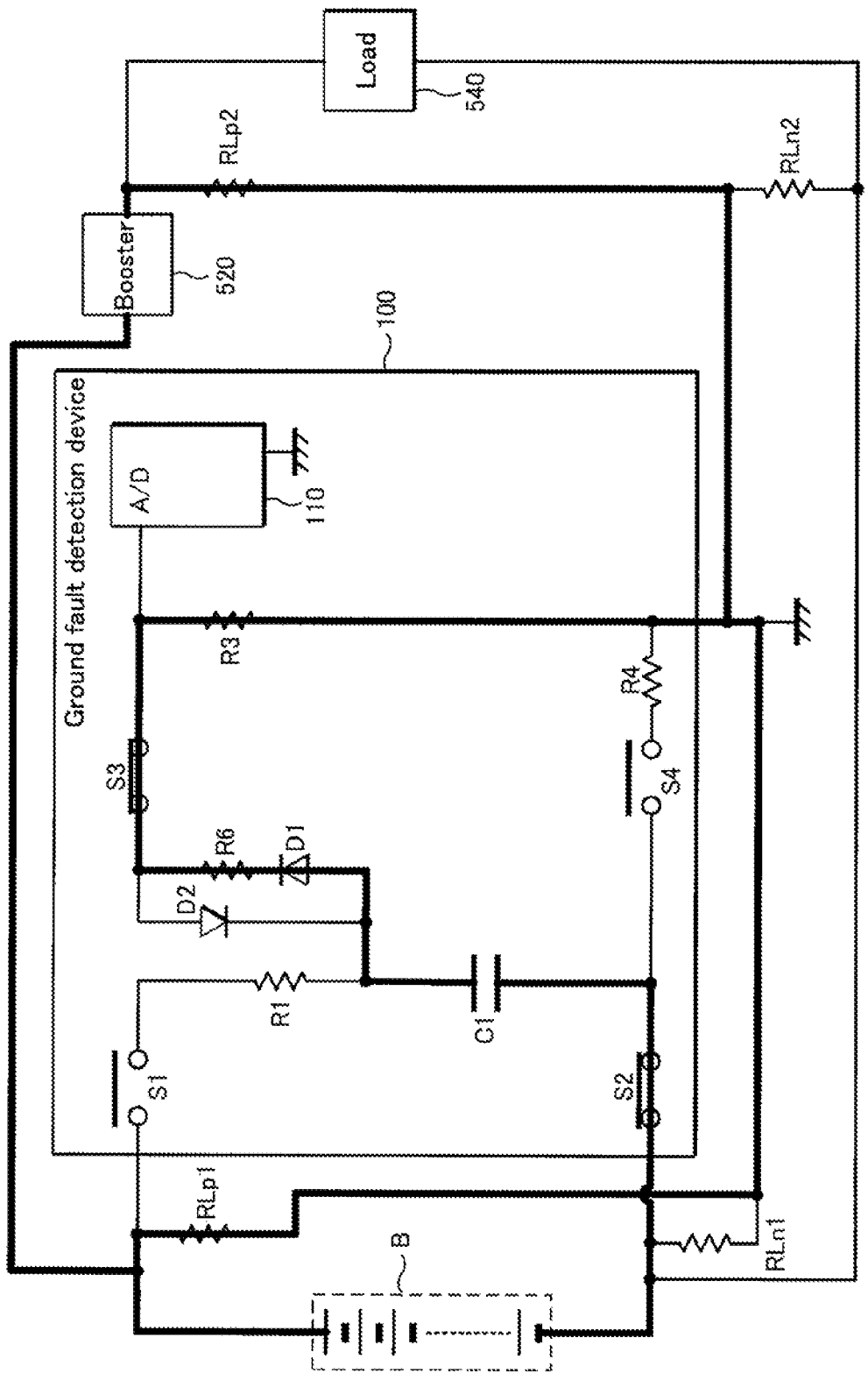
FIG. 6. is a diagram illustrating a Vcp-charging path.

During the Vcp-measurement period, a voltage which reflects an influence of the cathode side insulation resistance RLp is measured. For this purpose, the switch S2 and the switch S3 are switched on and the switch S1 and the switch S4 are switched off in order to perform charging of the voltage Vcp (S114). In this case, as shown in FIG. 6, the battery B, the cathode insulation resistance RLp, the resistance R3 and the capacitor C1 form a charging path, wherein the capacitor C1 is charged with the forward polarity.

Then, as shown in FIG. 4, the switch Si and the switch S2 are switched off and the switch S3 and the switch S4 are switched on in order to perform measurement of Vcp at the control device 110 (S115). And the same circuit is used to discharge the capacitor C1 for a subsequent measurement cycle (S116).

If no detour of electrical current has occurred, the control device 110 calculates the insulation resistance RL with reference to pre-created table data based on (Vcp+Vcn)/V0 which is calculated from V0, Vcn and Vcp obtained during the above described measurement periods (S107a). And if the insulation resistance RL is under a predetermined criterium reference level, it is determined that a ground fault has occurred, and issues an alert to an external control device.

Next, a case in which detour of electrical current has occurred due to an increased voltage during the Vcn-measurement period will be described. As mentioned above, if electrical current takes a detour and arrives, the capacitor C1 is charged with the opposed polarity. Accordingly, Vcn=0 (S106: Yes). However, considering influence of noise etc., for example a voltage under several tens of microvolts shall be considered as zero.

In this case, discharging of Vcn at the process (S107) is not performed and switching to the Vcp-charging path as shown in FIG. 6 is carried out with the charge remaining in the capacitor C1. I.e., the switch S2 and the switch S3 are switched on, while the switch S1 and the switch S4 are switched off.

In this way, charging of Vcp is performed while Vcn charged with the opposed polarity is offset. This charging shall be referred to as Vcn+p charging (S108). If detour of electrical current has occurred, Vcn is charging with a voltage formed by subtracting a voltage of the battery B from a ground voltage, Vcp is charging with a voltage formed by adding the voltage of the battery B to the ground voltage, and therefore Vcn+p is always a positive potential. Therefore, the Vcn+p measurement can be performed with the measurement circuit as shown in FIG. 4 (S109). And discharging the capacitor C1 is performed with the same circuit for a subsequent measurement (S110).

Then, the processes in the V0-measurement period (S111-S113) and the Vcp-measurement period (S114-S116) are carried out in order to calculate the insulation resistance RL (S117b).

For calculating the insulation resistance RL in case of detour of electrical current (S117b), the control device 110 subtracts Vcp obtained with the Vcp-measurement period (S115) from Vcn+p obtained with the Vcn+p measurement (S109) in order to calculate Vcn.

And (Vcp+Vcn)/V0 is calculated based on the calculated Vcn as well as V0 and Vcp obtained during the above described measurement periods, wherein the insulation resistance RL is calculated with reference to the pre-created table data (S107b). And if the insulation resistance RL is under a predetermined criterium reference level, it is determined that a ground fault has occurred, and issues an alert to an external control device.

Here, as shown in FIG. 3-6, the switch S1 and the switch S3 may not be switched on at the same time, and the switch S2 and the switch S4 may not be switched on, for the path in each of the measurement period.

Figure 7:
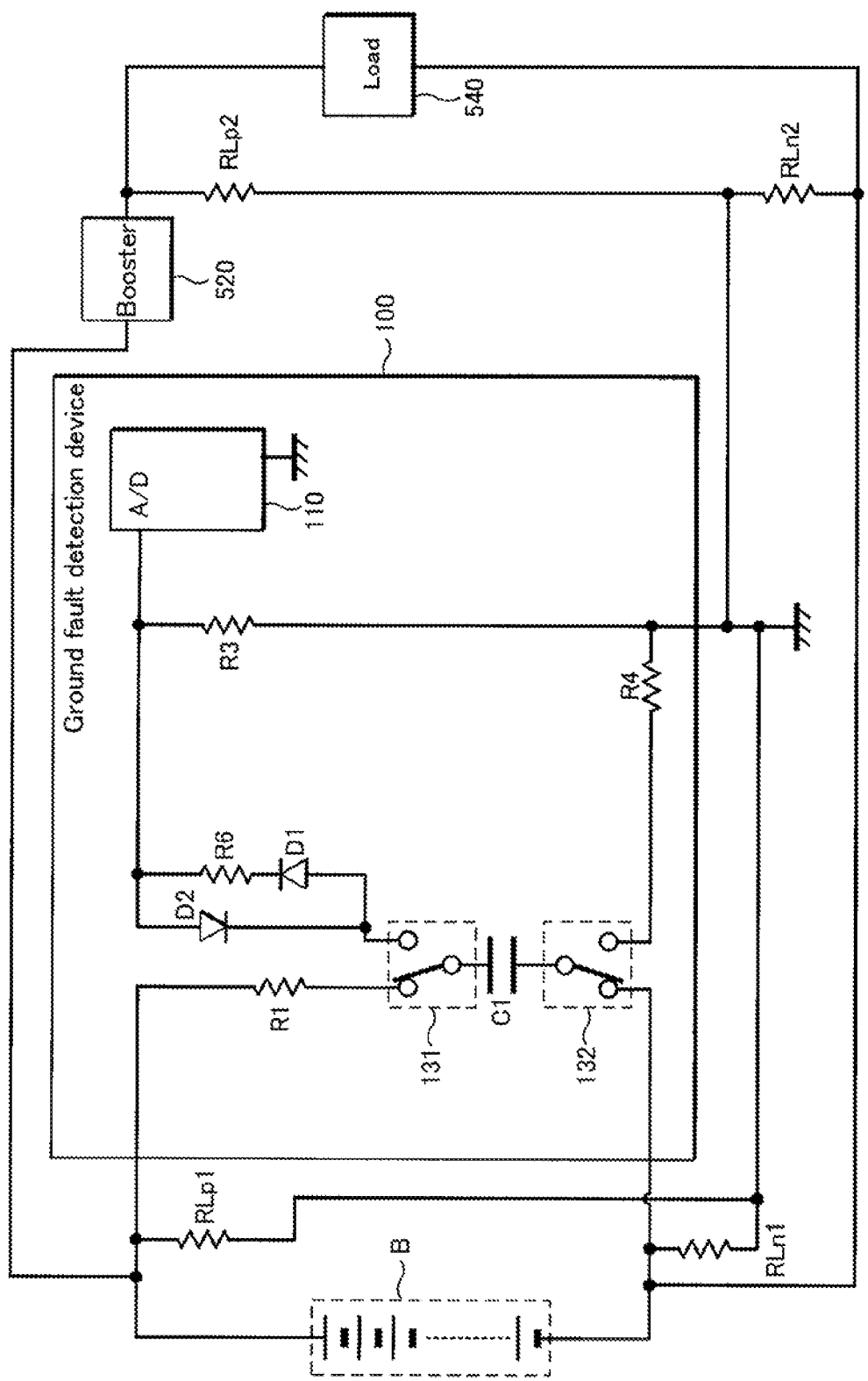
FIG. 7. is a block diagram showing another arrangement of the ground fault detection device according to the present embodiment.
Figure 8:
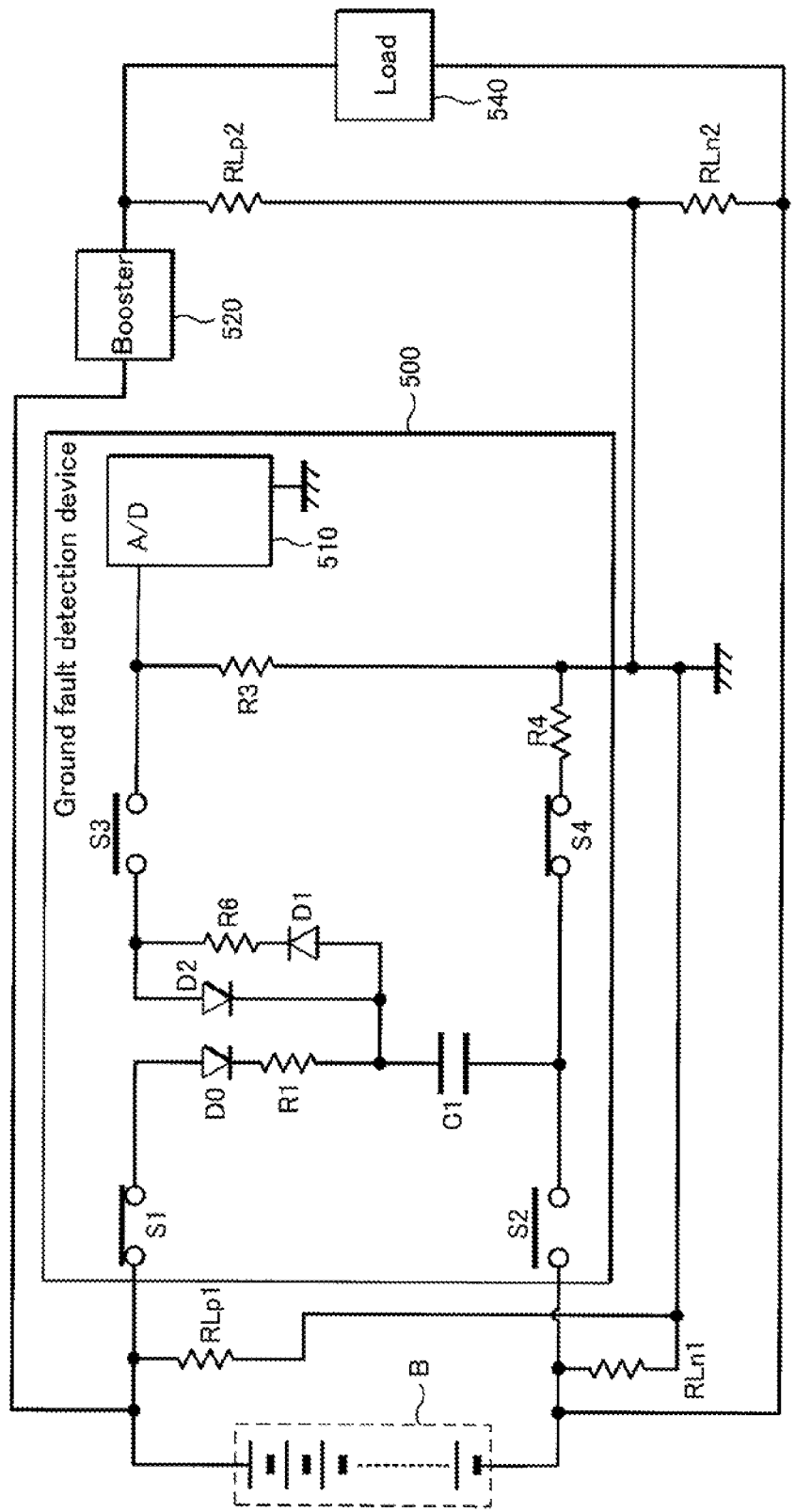
FIG. 8. is a block diagram showing an example for arrangement of a conventional ground fault detection device based on a flying capacitor.
Figure 9:
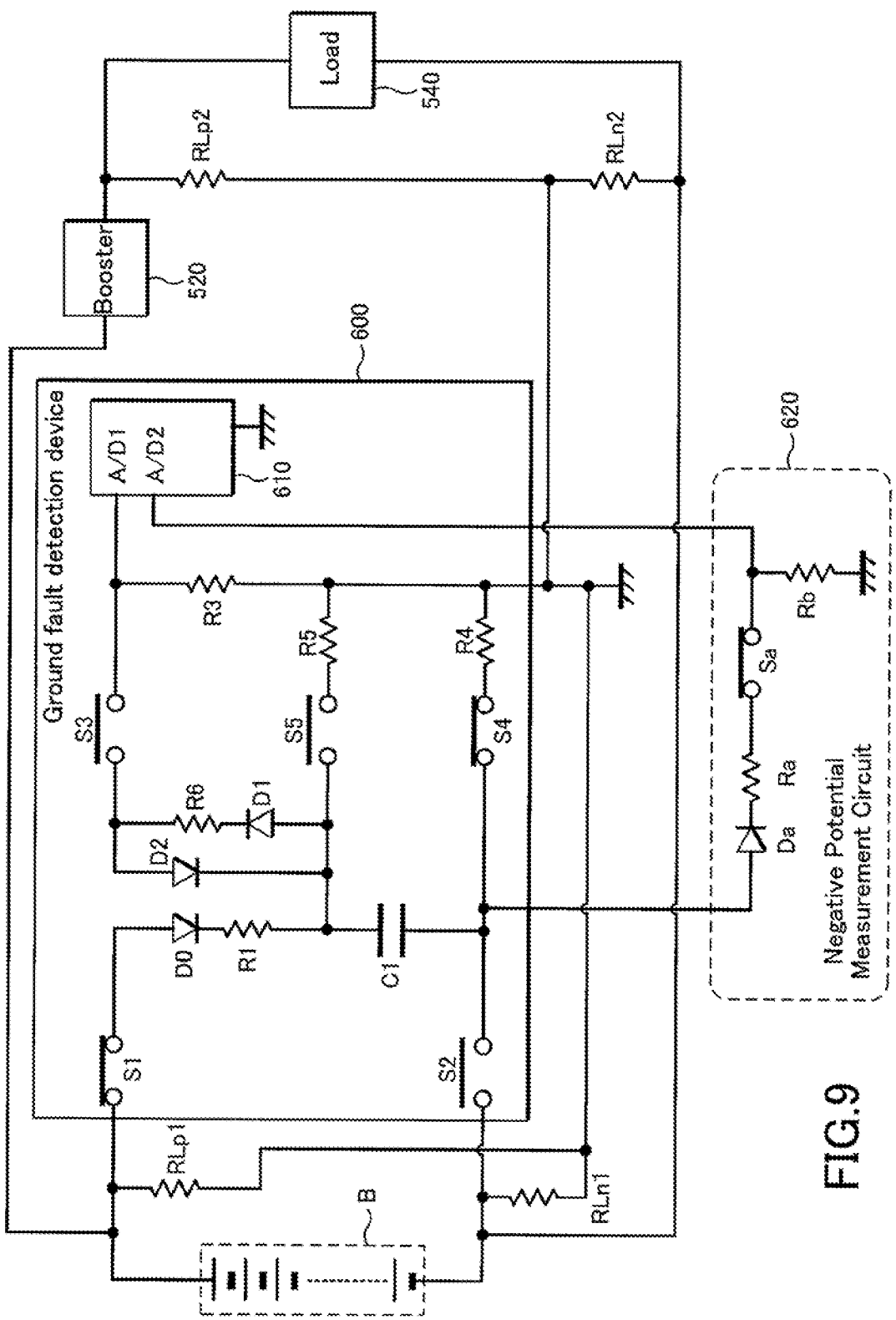
FIG. 9. is a block diagram showing a conventional arrangement which enables measurement of a charging voltage even if a flying capacitor is charged with an opposed polarity.

Therefore, as shown in FIG. 7, it is also possible that the switch S1 and switch S3 are configured as a C-contact relay 131 and the switch S2 and the switch S4 are configured as a C-contact relay 132. The C-contact relays 131 and 132 are connected so that the C-contacts of both relays are facing toward the capacitor C1.

The C-contact relays 131 and 132 may be formed e.g. from small signal mechanical relays or reed relays for high voltage. Accordingly, four optical MOS-FETs can be omitted which result in high costs, and therefore the ground fault detection device 100 can be configured with low costs.

REFERENCE SIGNS LIST

100 Ground fault detection device
110 Control device
131 C-contact relay
132 C-contact relay
520 Booster
540 Load

What is claimed is:

1. A ground fault detection device which is configured to be connected to a non-grounded battery which is configured to supply a load with electric power via a booster circuit, wherein the ground fault detection device calculates an insulation resistance of a system including the battery in order to detect a ground fault, the ground fault detection device comprising:

a capacitor which serves as a flying capacitor;
a switch group which switches between
  a V0-charging path with the battery and the capacitor,
  a Vcn-charging path with the battery, a negative side insulation resistance and the capacitor, the negative side insulation resistance being an insulation resistance between a negative side of the battery and a ground,
  a Vcp-charging path with the battery, a positive side insulation resistance and the capacitor, the positive side insulation resistance being an insulation resistance between a positive side of the battery and the ground, and
  a charging voltage measurement path for the capacitor; and
a controller which controls the switch group and calculates the insulation resistance based on V0, Vcn and Vcp, wherein V0 is a measured value on the V0-charging path, Vcn is a measured value on the Vcn-charging path, and Vcp is a measured value on the Vcp charging path;
wherein, if Vcn can be considered as zero, the controller switches to the Vcp-charging path and performs measurement while keeping a charged state of the capacitor, wherein Vcp obtained after discharging the capacitor is subtracted from a measured value obtained from the measurement in order to calculate Vcn.

2. The ground fault detection device according to claim 1, wherein the switch group is formed from two C-contact relays.

* * * * *